(12) United States Patent
Lo et al.

(10) Patent No.: US 10,381,508 B2
(45) Date of Patent: Aug. 13, 2019

(54) LIGHT EMITTING ELEMENT WITH AN ENHANCED ELECTROLUMINESCENCE EFFECT

(71) Applicant: NATIONAL SUN YAT-SEN UNIVERSITY, Kaohsiung (TW)

(72) Inventors: I-Kai Lo, Kaohsiung (TW);
Ying-Chieh Wang, Kaohsiung (TW);
Yu-Chi Hsu, Kaohsiung (TW);
Cheng-Hung Shih, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 16/158,856

(22) Filed: Oct. 12, 2018

(65) Prior Publication Data

US 2019/0044022 A1    Feb. 7, 2019

Related U.S. Application Data

(60) Continuation-in-part of application No. 15/186,370, filed on Jun. 17, 2016, now abandoned, which is a
(Continued)

(30) Foreign Application Priority Data

Nov. 19, 2014    (TW) .............................. 103140122 A

(51) Int. Cl.
*H01L 33/00* (2010.01)
*H01L 33/18* (2010.01)
(Continued)

(52) U.S. Cl.
CPC ........ *H01L 33/0075* (2013.01); *H01L 33/007* (2013.01); *H01L 33/16* (2013.01);
(Continued)

(58) Field of Classification Search
CPC ................................................. H01L 33/0075
See application file for complete search history.

(56) References Cited

U.S. PATENT DOCUMENTS

| | | |
|---|---|---|
| 5,661,316 A | 8/1997 | Kish, Jr. et al. |
| 5,787,104 A | 7/1998 | Kamiyama et al. |
| 6,420,197 B1 | 7/2002 | Ishida et al. |
| 7,009,218 B2 | 3/2006 | Sugimoto et al. |
| 7,057,211 B2 | 6/2006 | Dwilinski et al. |
| 7,436,039 B2 | 10/2008 | Zhu et al. |
| 7,750,355 B2 | 7/2010 | Dwilinski et al. |
| 7,863,172 B2 | 1/2011 | Zhu et al. |

(Continued)

FOREIGN PATENT DOCUMENTS

| | | |
|---|---|---|
| CN | 1575534 | 2/2005 |
| TW | 201338134 | 9/2013 |

OTHER PUBLICATIONS

V. Ramachandran, R. M. Feenstra, W. L. Sarney, L. Salamanca-Riba, J. E. Northrup, L. T. Romano, and D. W. Greve, Inversion of wurtzite GaN(0001) by exposure to magnesium. Appl. Phys. Lett. 75, 808 (1999). (Year: 1999).*

*Primary Examiner* — Thao X Le
*Assistant Examiner* — Laura M Dykes
(74) *Attorney, Agent, or Firm* — WPAT, PC

(57) ABSTRACT

This invention discloses a light emitting element to solve the problem of lattice mismatch and inequality of electron holes and electrons of the conventional light emitting elements. The light emitting element comprises a gallium nitride layer, a gallium nitride pyramid, an insulating layer, a first electrode and a second electrode. The gallium nitride pyramid contacts with the gallium nitride layer, with a c-axis of the gallium nitride layer opposite in direction to a c-axis of the gallium nitride pyramid, and with an M-plane of the gallium nitride layer parallel to an M-plane of the gallium nitride pyramid, with broken bonds at the mounting face of the gallium nitride layer and the larger end face of the gallium nitride pyramid welded with each other, with the gallium nitride layer and the gallium nitride pyramid being used as a p-type semiconductor and an n-type semiconductor respectively.

6 Claims, 9 Drawing Sheets

Related U.S. Application Data division of application No. 14/584,523, filed on Dec. 29, 2014, now abandoned.

(51) Int. Cl.
  *H01L 33/40* (2010.01)
  *H01L 33/24* (2010.01)
  *H01L 33/16* (2010.01)
  *H01L 33/20* (2010.01)
  *H01L 33/44* (2010.01)
  *H01L 33/32* (2010.01)

(52) U.S. Cl.
  CPC .............. *H01L 33/18* (2013.01); *H01L 33/20* (2013.01); *H01L 33/24* (2013.01); *H01L 33/40* (2013.01); *H01L 33/32* (2013.01); *H01L 33/44* (2013.01); *H01L 2933/0016* (2013.01); *H01L 2933/0025* (2013.01)

(56) References Cited

U.S. PATENT DOCUMENTS

| | | |
|---|---|---|
| 7,935,550 B2 | 5/2011 | Dwilinski et al. |
| 2002/0079502 A1 | 6/2002 | Ishibashi et al. |
| 2002/0104999 A1 | 8/2002 | Nakajima et al. |
| 2002/0171090 A1 | 11/2002 | Oohata et al. |
| 2004/0159836 A1 | 8/2004 | Sugimoto et al. |
| 2004/0238810 A1* | 12/2004 | Dwilinski .............. B82Y 20/00 257/12 |
| 2006/0091417 A1 | 5/2006 | Sugimoto et al. |
| 2010/0075175 A1 | 3/2010 | Poblenz et al. |
| 2010/0142576 A1 | 6/2010 | Cohen et al. |
| 2011/0101371 A1 | 5/2011 | Zhu et al. |
| 2011/0127549 A1* | 6/2011 | Lee ...................... H01L 27/153 257/88 |
| 2014/0099739 A1 | 4/2014 | Lien et al. |

* cited by examiner 4.0μm×17.3k 0.8μm×86.7k 0.5μm×139k 0.8μm×86.7k 0.8μm×86.7k 0.8μm×86.7k 1.0μm×52k 1.0μm×52k

LIGHT EMITTING ELEMENT WITH AN ENHANCED ELECTROLUMINESCENCE EFFECT

CROSS REFERENCE TO RELATED APPLICATIONS

This is a continuation-in-part of U.S. patent application Ser. No. 15/186,370 filed on Jun. 17, 2016, which is a division of U.S. patent application Ser. No. 14/584,523 filed on Dec. 29, 2014. The application claims the benefit of Taiwan application serial No. 103140122, filed on Nov. 19, 2014, and the subject matter of which is incorporated herein by reference.

BACKGROUND OF THE INVENTION

1. Field of the Invention

The present invention generally relates to a light emitting element and, more particularly, to a lattice-matched light emitting element.

2. Description of the Related Art

With the progress of the semiconductor technology, light emitting elements, such as light-emitting diodes, made by the solid-state element technique have been gradually developed and can be used in illumination, display, or measurement. The advantages of light emitting elements are that light emitting elements take little electricity but have long service life. Conventional light emitting elements include a p-type semiconductor and an n-type semiconductor. The energy of electron-holes in the p-type semiconductor recombining with electrons in the n-type semiconductor can be released as photons, by which light glows.

In the conventional light emitting element, the n-type semiconductor is taken as a substrate, and the p-type semiconductor is deposited on a part of a surface of the substrate. However, in this type of light emitting element, an area of the p-type semiconductor is smaller than an area of the n-type semiconductor at p-n interfaces, so the quantity of electron-holes in the p-type semiconductor is smaller than the quantity of electrons in the n-type semiconductor. The inequality of the electron-holes and electrons may cause the possibility of carrier recombination decrease, and result in low light-emitting efficiency of the conventional light emitting element.

Moreover, when the p-type semiconductor couples with the n-type semiconductor, it's difficult to match the lattice direction of the p-type semiconductor with the lattice direction of the n-type semiconductor, which causes the lattice mismatch between these two semiconductors. Therefore, lots of epitaxial defects are likely to generate at p-n interfaces, increase the resistance of the p-n interfaces and decrease the intensity of current passing through the p-n junction, which further results in the low light-emitting efficiency and the low light-emitting stability of the conventional light emitting element.

In light of this, it is necessary to improve the conventional light emitting element.

SUMMARY OF THE INVENTION

It is therefore the objective of this invention to provide a lattice-matched light emitting element which has similar quantity of electron-holes and electrons.

One embodiment of the invention discloses a light emitting element, which includes a gallium nitride layer having a mounting face, with the gallium nitride layer growing in [0001] direction of a four-axis coordinate system; a gallium nitride pyramid having a larger end face and a smaller end face, with the gallium nitride pyramid growing in [000$\underline{1}$] direction of the four-axis coordinate system, with the larger end face of the gallium nitride pyramid contacting with the mounting face of the gallium nitride layer, with a c-axis of the gallium nitride layer coaxial with a c-axis of the gallium nitride pyramid, and with an M-plane of the gallium nitride layer parallel to an M-plane of the gallium nitride pyramid, with broken bonds at the larger end face of the gallium nitride pyramid and the mounting face of the gallium nitride layer welding together, with the gallium nitride layer being a p-type semiconductor and the gallium nitride pyramid being an n-type semiconductor; an insulating layer covering surfaces of the gallium nitride layer and the gallium nitride pyramid, with a portion of the gallium nitride pyramid not covered by the insulating layer to form an electrically conductive portion of the gallium nitride pyramid and a portion of the gallium nitride layer not covered by the insulating layer to form and electrically conductive portion of the gallium nitride layer; a first electrode electrically connecting the electrically conductive portion of the gallium nitride pyramid; and a second electrode disposing on the electrically conductive portion of the gallium nitride layer, with a top of the gallium nitride pyramid truncated and flush with a surface of insulating layer.

In a preferred form shown, the insulating layer can be an oxidation layer.

In the preferred form shown, the oxidation layer can contain aluminum oxide or silicon oxide.

In the preferred form shown, a thickness of the insulating layer can be 200-300 nm.

In the preferred form shown, the first electrode can be made of titanium, aluminum, titanium-aluminum alloy, titanium-nickel alloy, or titanium-aluminum-nickel-gold alloy.

In the preferred form shown, the second electrode can be made of nickel-platinum alloy, nickel-gold alloy, or nickel-platinum-gold alloy.

Accordingly, in the above light emitting element, the large end face of the gallium nitride pyramid contacts with the mounting face of the gallium nitride layer, the c-axis of the gallium nitride pyramid is coaxial with the c-axis of the gallium nitride layer, the M-plane of the gallium nitride pyramid is parallel to the M-plane of the gallium nitride layer, and the broken bonds at the large end face of the gallium nitride pyramid and the mounting face of the gallium nitride layer weld together. Hence, the gallium nitride layer and the gallium nitride pyramid tightly couple together to match the lattice of the gallium nitride layer with the lattice of the gallium nitride pyramid, while avoiding epitaxial defects generated and reinforcing the bonding between the gallium nitride layer and the gallium nitride pyramid to enhance the coupling strength, thereby permitting free flow of electrons to enhance the electroluminescence effect. The effects of increasing the light emitting efficiency and improving the light emitting stability can, thus, be achieved.

BRIEF DESCRIPTION OF THE DRAWINGS

The present invention will become more fully understood from the detailed description given hereinafter and the accompanying drawings which are given by way of illustration only, and thus are not limitative of the present invention, and wherein:

FIGS. 6c and 6d are enlarged images of a slant face of the gallium nitride pyramid in FIG. 6a.

Figure 1:
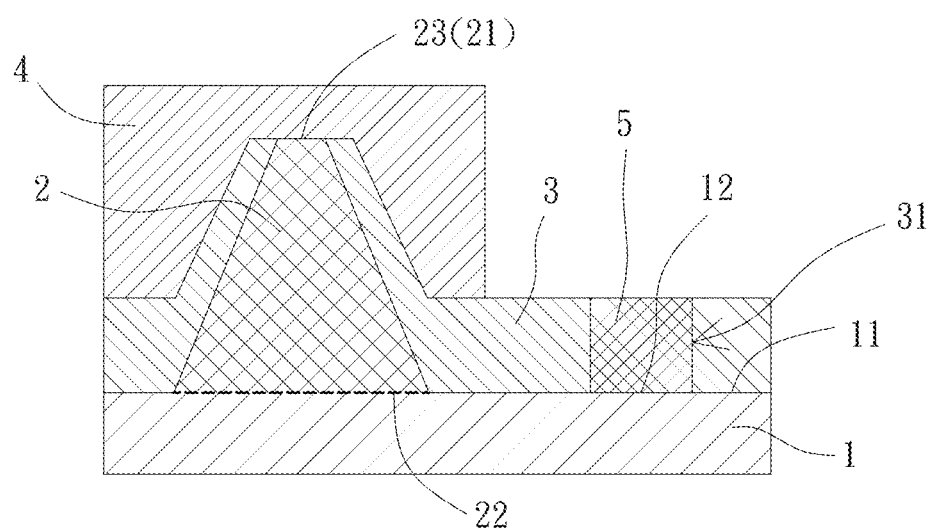
FIG. 1 is a cross-sectional view of a light emitting element according to an embodiment of the invention.

In the various figures of the drawings, the same numerals designate the same or similar parts. Furthermore, when the term "first", "second", "top", "bottom", "side" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

The term "hexagonal frustum" referred to herein means a hexagonal pyramid originally having an apex and a bottom face is cut to remove the apex, with two opposite ends of the hexagonal pyramid respectively forming a cut end and a connection end. Cross sections of the cut end and the connection end are both hexagonal. An area of the cut end is smaller than an area of the connection end, which can be appreciated by one having ordinary skill in the art.

The term "semiconductor" referred to herein means a material having a controllable conductivity in a range between a conductor and an insulating member (namely, the band gap is larger than 9 eV), such as silicon (Si), germanium (Ge), or gallium arsenide (GaAs), which can be appreciated by one having ordinary skill in the art.

The term "electroluminescence effect" referred to herein means recombination of an electron and an electron-hole in a p-n junction of a light-emitting diode (LED) to emit light beams while a current flowing through the p-n junction of the light-emitting diode, which can be appreciated by one having ordinary skill in the art.

FIG. 1 is a cross sectional view of a light emitting element according to an embodiment of the present invention. The embodiment of the light emitting element includes a gallium nitride layer 1, a gallium nitride pyramid 2, and insulating layer 3, a first electrode 4 and a second electrode 5. The gallium nitride layer 1 connects to the gallium nitride pyramid 2. The insulating layer 3 covers the surface of the gallium nitride layer 1 and the gallium nitride pyramid 2. The first electrode 4 electrically connects to the gallium nitride pyramid 2. The second electrode 5 electrically connects to the gallium nitride layer 1.

Figure 2A:
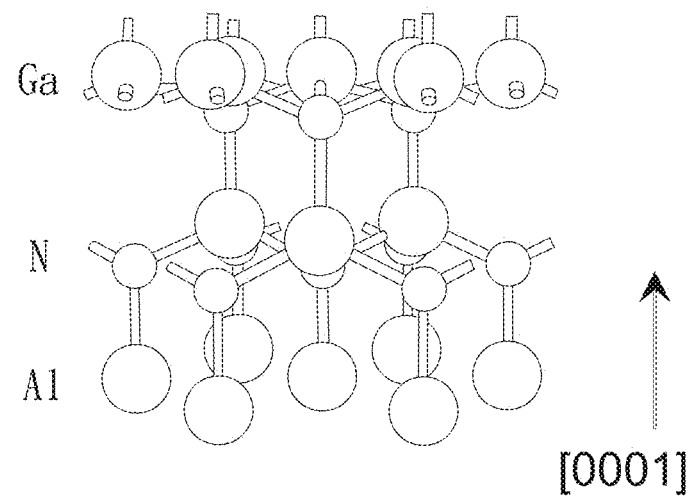
FIG. 2a is a diagrammatic view illustrating the growing direction of a gallium nitride layer of the light emitting element of the embodiment of the invention.

The gallium nitride layer 1 is disposed on a substrate. The substrate can be an aluminum nitride (AlN) substrate or a sapphire substrate. The gallium nitride layer 1 is grown along the [0001] direction of a four-axis coordinate system (see FIG. 2a). An end of the gallium nitride layer 1 away from the substrate is terminated with nitrogen element while the gallium nitride layer 1 crystallizing. The gallium nitride layer 1 includes a mounting face 11 and an electrically conductive portion 12. The mounting face 11 connects the gallium nitride pyramid 2, and the electrically conductive portion 12 connects the second electrode 5.

Figure 2B:
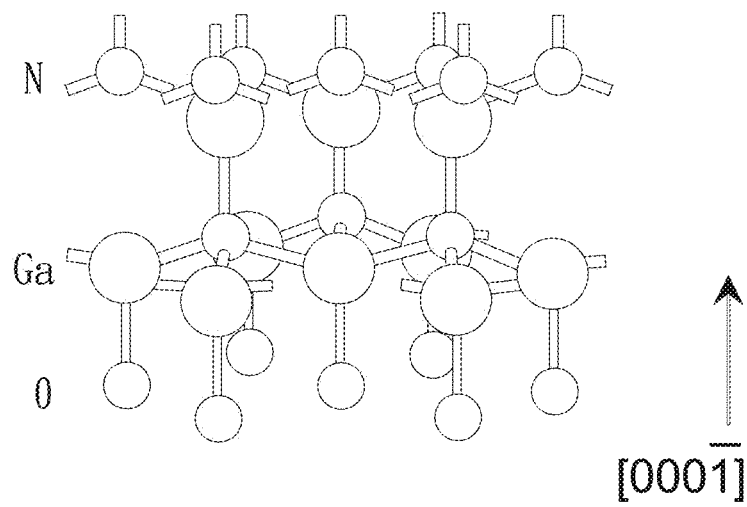
FIG. 2b is a diagrammatic view illustrating the growing direction of a gallium nitride pyramid of the light emitting element of the embodiment of the invention.
Figure 2C:
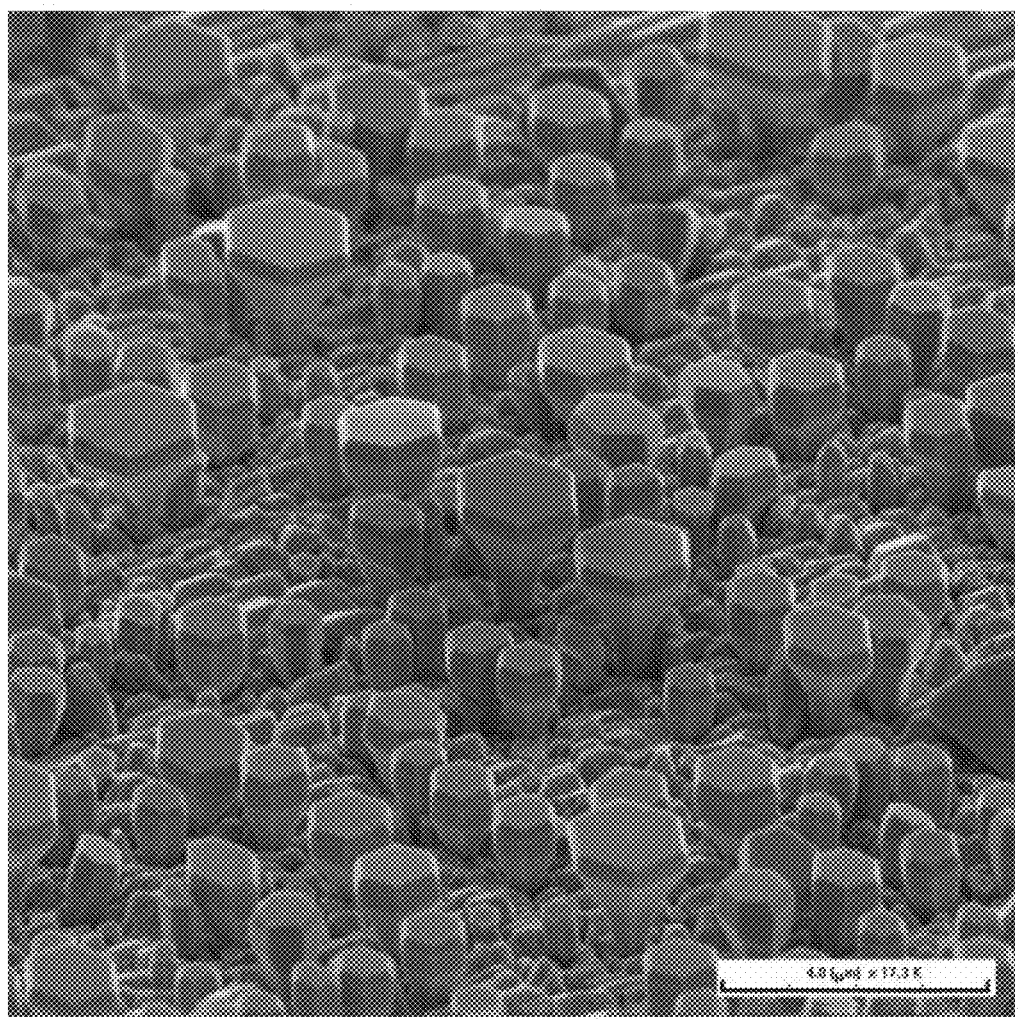
FIG. 2c is an image of a group of gallium nitride pyramid samples of the light emitting element of the embodiment of the invention.

The gallium nitride pyramid 2 includes a smaller end face 21 and a larger end face 22. The gallium nitride pyramid 2 grows along the [000$\bar{1}$] direction of the four-axis coordinate system (see FIG. 2b). The larger end face 22 of the gallium nitride pyramid 2 is terminated with gallium element while the gallium nitride pyramid 2 crystallizing. The gallium nitride pyramid 2 can form a prism and a pyramid (the sample of which is shown in FIG. 2c and is in the form of a hexagonal frustum). A non-restrictive example of the manufacturing method of the gallium nitride pyramid 2 is disclosed in U.S. Pat. No. 8,728,235 B2.

Figure 2D:
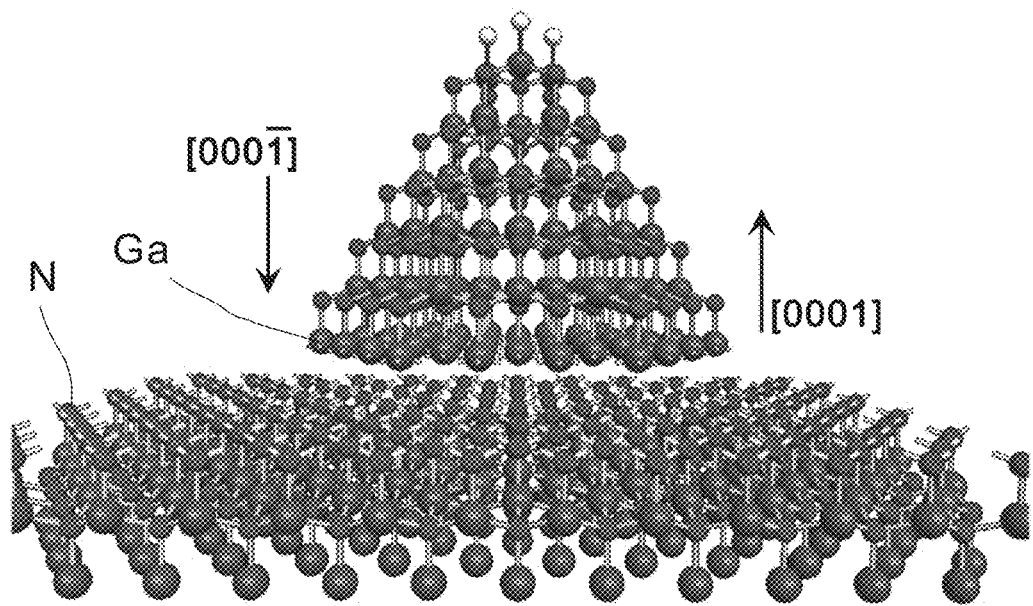
FIG. 2d is a diagrammatic view illustrating the alignment of the gallium nitride layer and the gallium nitride pyramid of the light emitting element of the embodiment of the invention.

Referring to FIGS. 1 and 2d, the larger end face 22 of the gallium nitride pyramid 2 contacts with the mounting face 11 of the gallium nitride layer 1. The c-axis of the gallium nitride layer 1 is coaxial with the c-axis of the gallium nitride pyramid 2 and the M-plane of the gallium nitride layer 1 is parallel to the M-plane of the gallium nitride pyramid 2 which makes the lattice of the gallium nitride layer 1 to match with the lattice of the gallium nitride pyramid 2. By taking the gallium nitride layer 1 and the gallium nitride pyramid 2 as a p-type semiconductor and an n-type semiconductor respectively, the quantity of electron-holes in the p-type semiconductor increase because of the large volume of the gallium nitride layer 1. The carrier recombination possibility at interfaces of the gallium nitride layer 1 and the gallium nitride pyramid 2 increase, which further makes the conductivity increase. Each of the gallium nitride layer 1 and the gallium nitride pyramid 2 includes a hexagonal lattice which is a lattice structure similar to a hexagonal prism. The c-axis direction (the [0001] direction) is the extension direction of the hexagonal prism, and the M-plane is the six side faces of the hexagonal prism, which can be appreciated by one having ordinary skill in the art.

Figure 2E:
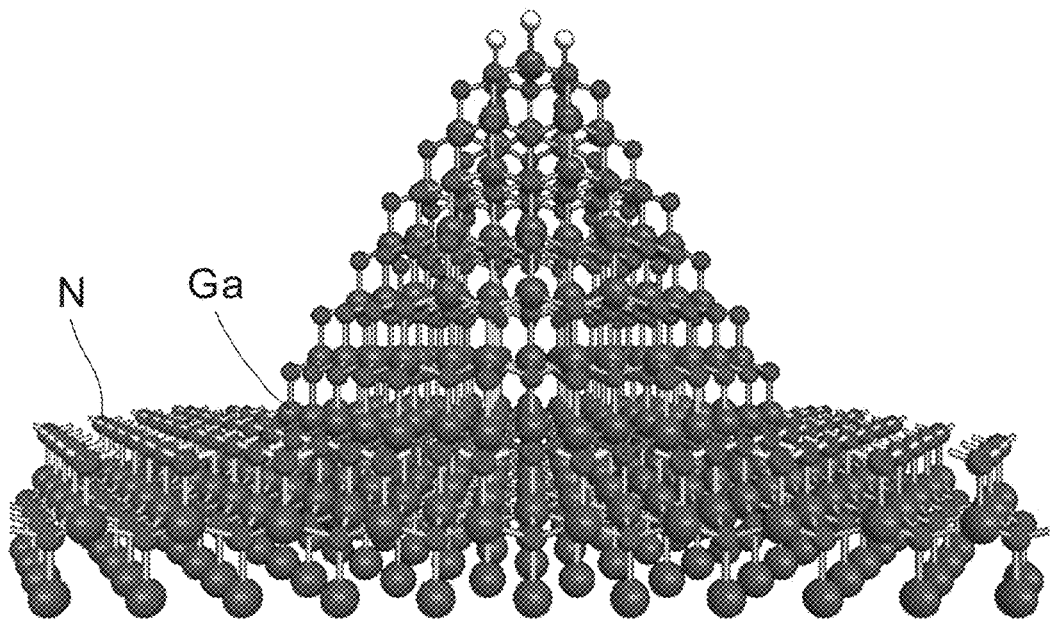
FIG. 2e is a diagrammatic view illustrating welding of broken bonds at contact faces of the gallium nitride layer and the gallium nitride pyramid of the light emitting element of the embodiment of the invention.

To tightly couple the gallium nitride pyramid 2 and the gallium nitride layer 1, an annealing process can be taken to make the broken bonds at the larger end face 22 of the gallium nitride pyramid 2 and the mounting face 11 of the gallium nitride layer 1 weld together, and form the structure shown in FIG. 2e. The end of the gallium nitride layer 1 away from the substrate is terminated with nitrogen elements. The larger end face 22 of the gallium nitride pyramid 2 is terminated with gallium elements. The nitrogen elements of the gallium nitride layer 1 and the gallium elements of the gallium nitride pyramid 2 can form chemical bonds, and therefore turn into complete gallium nitride lattices without generating epitaxial defects. Therefore, the resistance generated as electrons passing through the interfaces of the gallium nitride pyramid 2 and the gallium nitride layer 1 can be decreased.

Referring to FIG. 1, the insulating layer 3 covers surfaces of the gallium nitride layer 1 and the gallium nitride pyramid 2, but does not cover the electrically conductive portions 12 and 23. The insulating layer 3 is used to isolate the p-type semiconductor from the n-type semiconductor, i.e., to insulate the gallium nitride layer 1 and the gallium nitride pyramid 2. The insulating layer 3 can be an oxidation layer, such as an insulating material containing aluminum oxide ($Al_2O_3$) or silicon oxide ($SiO_2$). The thickness of the insulating layer 3 can be 200-300 nm to provide a proper insulation. However, the present disclosure is not limited to this example. The insulating layer 3 further includes a hole 31 located above the electrically conductive portion 12.

The first electrode 4 electrically connects to the electrically conductive portion 23 of the gallium nitride pyramid 2 for the gallium nitride pyramid 2 electrically connecting to an eternal power source (not shown). The first electrode 4 can be disposed on the electrically conductive portion 23 by deposition method or epitaxy method. In addition to contacting with the electronically conductive portion 23, the first electrode 4 can further cover a protruded portion of the gallium nitride pyramid 2 to protect the gallium nitride pyramid 2. The first electrode 4 can be made of conductive materials such as titanium, aluminum, titanium-aluminum (Ti/Al) alloy, titanium-nickel (Ti/Ni) alloy, or titanium-aluminum-nickel-gold (Ti/Al/Ni/Au) alloy to provide a propriate electrically connecting effect. However, the present disclosure is not limited to this example.

The second electrode 5 electrically connects to the electrically conductive portion 12 of the gallium nitride layer 1 for the gallium nitride layer 1 electrically connecting to an eternal power source (not shown). The second electrode 5 can be disposed on the electrically conductive portion 12 by deposition method or epitaxy method. The second electrode 5 can be made of conductive materials such as nickel-platinum (Ni/Pt) alloy, nickel-gold (Ni/Au) alloy or nickel-platinum-gold (Ni/Pt/Au) alloy to provide an appropriate electrically connecting effect. However, the present disclosure is not limited to this example.

Figure 3A:
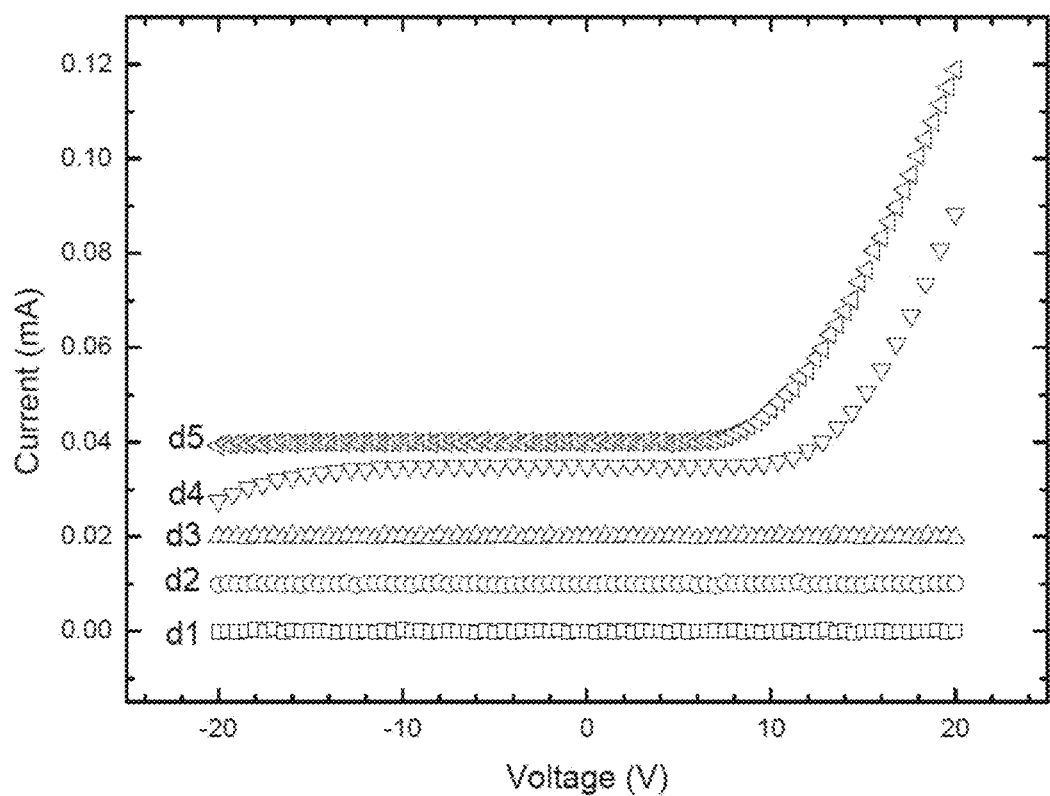
FIG. 3a is a current-voltage diagram of the light emitting element of the embodiment of the invention.
Figure 3B:
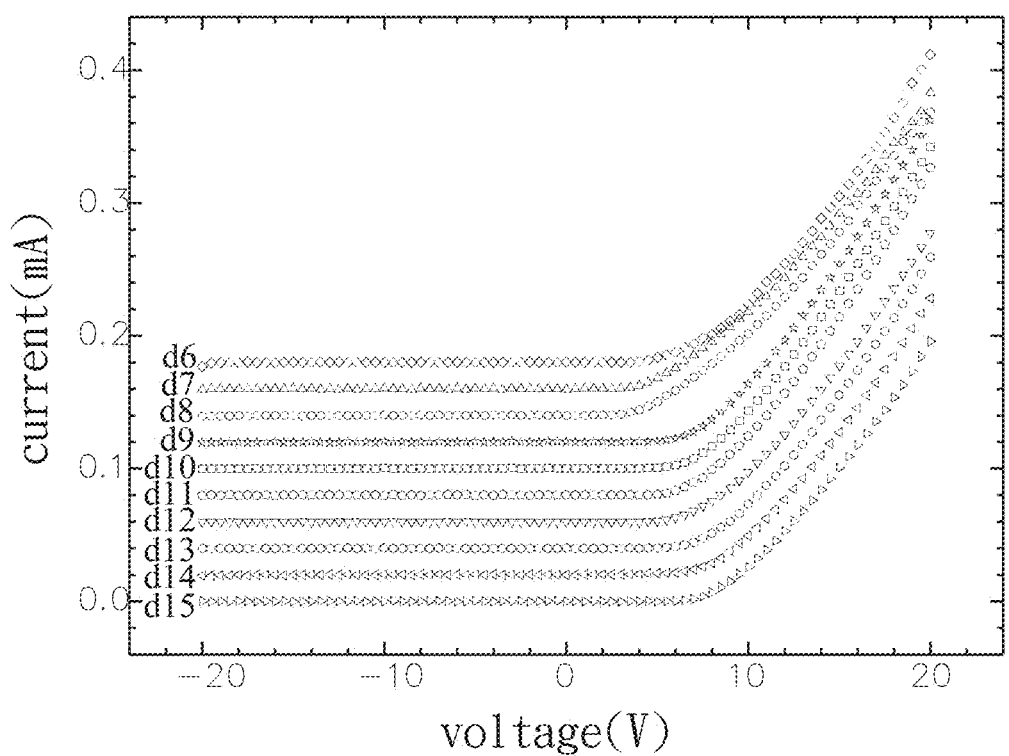
FIG. 3b is another current-voltage diagram of the light emitting element of the embodiment of the invention.

FIGS. 3a and 3b are current-voltage diagrams of the light emitting element of the embodiment of the present invention. Fifteen gallium nitride pyramids of the same wafer of FIG. 2c were used as samples (labelled as No. d1-d15) for testing. A current with voltages in a range between −20V and +20V was applied to the first and second electrodes 4 and 5 shown in FIG. 1. From the result shown in FIGS. 3a and 3b, the current-voltage curves of most of the gallium nitride pyramids are similar to a proper current-voltage curve for a light emitting element, with the resistance being about 45 KΩ, and the critical voltage being about 5.9V.

Figure 4A:
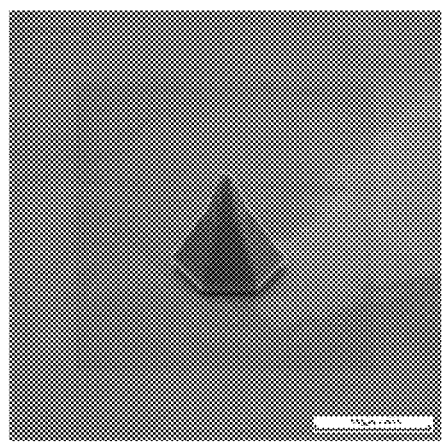
FIG. 4a is a scanning electron microscope (SEM) image of a gallium nitride pyramid and a gallium nitride layer of a sample of the light emitting element according to the embodiment of the invention.
Figure 4B:
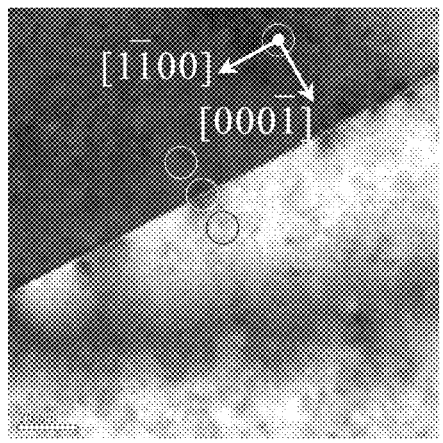
FIG. 4b is a transmission electron microscope (TEM) image of interfaces of the gallium nitride pyramid and the gallium nitride layer of the sample of the light emitting element of the embodiment of the invention.
Figure 4C:
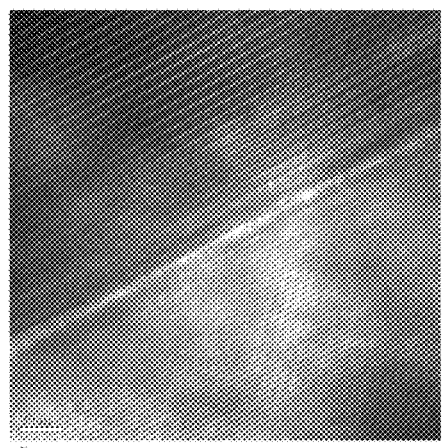
FIG. 4c is an enlarged image of the interfaces of the gallium nitride pyramid and the gallium nitride layer of the sample of the light emitting element of the embodiment of the invention.
Figure 4D:
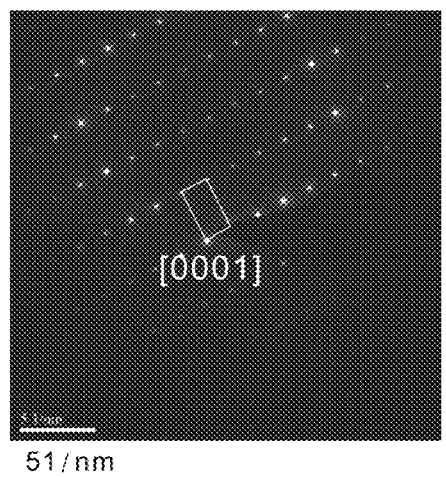
FIG. 4d is an image showing the measurement result of the gallium nitride pyramid with the incident direction along [11$\bar{2}$0] of the sample of the light emitting element of the embodiment of the invention.
Figure 4E:
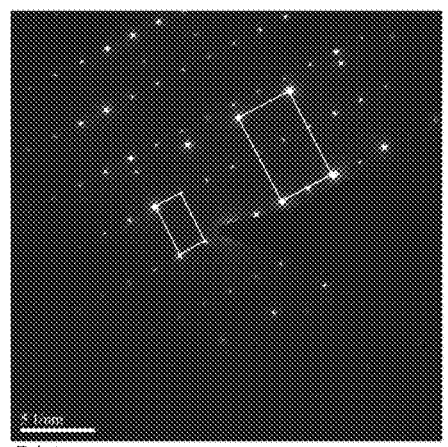
FIG. 4e is an image showing mismatch of the lattice directions of the gallium nitride pyramid and the gallium nitride pyramid of the SAD sample with the same incident direction as the incident direction shown in FIG. 4d and FIG. 4f.
Figure 4F:
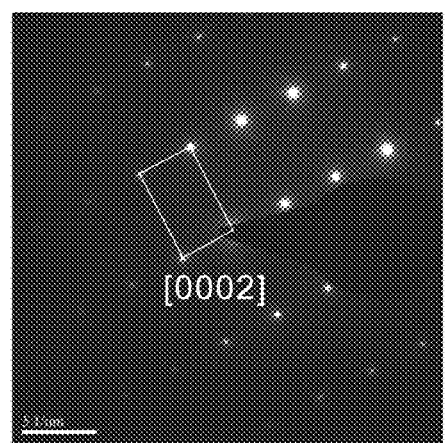
FIG. 4f is an image showing the measurement result of the gallium nitride layer with the incident direction along [11$\bar{2}$0] of the sample of the light emitting element of the embodiment of the invention.

FIGS. 4a-4f are images of structure analysis of a sample of the light emitting element according to the embodiment of the present invention, with the images obtained from No. d3 gallium nitride pyramid sample. Specifically, FIG. 4a is a scanning electron microscope (SEM) image of the gallium nitride pyramid and the gallium nitride layer after annealing at about 700° C. FIG. 4b is a transmission electron microscope (TEM) image of the interfaces of the gallium nitride pyramid and the gallium nitride layer with the incident direction along [11$\bar{2}$0]. FIG. 4c is an enlarged image of the interfaces, with the gap between the gallium nitride pyramid and the gallium nitride layer clearly shown in the high-resolution TEM image, and with selected area diffraction (SAD) used to obtain an area surrounding the interface in FIG. 4b to analyze the TEM sample. FIG. 4d is an image showing the measurement result of the gallium nitride pyramid with the incident direction along [11$\bar{2}$0]. FIG. 4f is an image showing the measurement result of the gallium nitride layer with the incident direction along [11$\bar{2}$0]. FIG. 4e is an image showing mismatch of the lattice directions of the gallium nitride pyramid and the gallium nitride pyramid of the SAD sample with the same incident direction as the incident direction shown in FIG. 4d and FIG. 4f. Thus, it shows that the proper current-voltage curve for a light emitting element cannot be successfully measured from the sample if the lattice direction of the gallium nitride pyramid mismatches with the lattice direction of the gallium nitride layer.

Figure 5A:
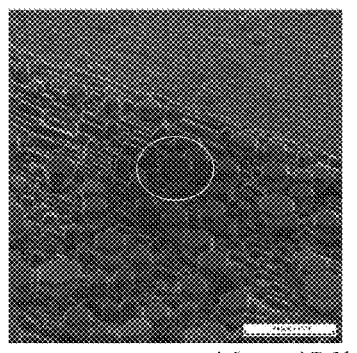
FIGS. 5a-5c are electron microscope images of a gallium nitride pyramid of another sample of the light emitting element according to the embodiment of the invention.
Figure 5B:
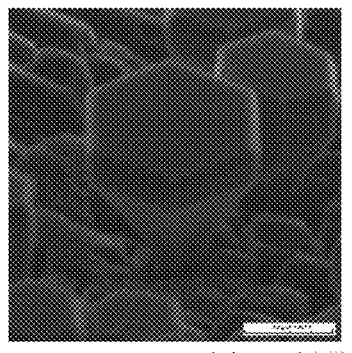
Figure 5C:
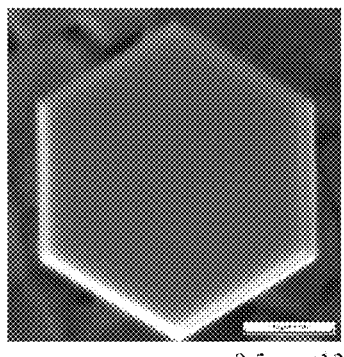
Figure 5D:
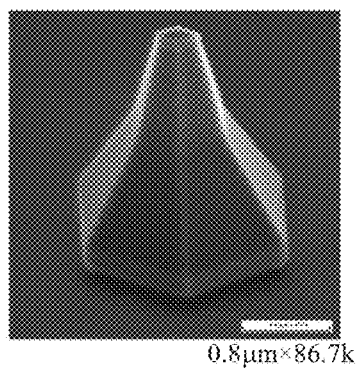
FIG. 5d is an image of the gallium nitride pyramid inversely disposed on a gallium nitride layer of the sample of the light emitting element of the embodiment of the invention.
Figure 5E:
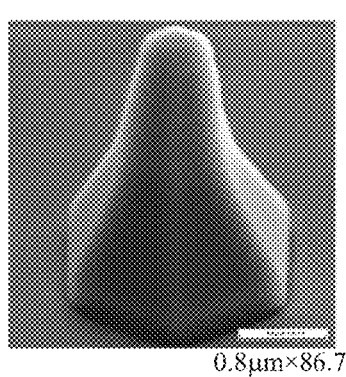
FIG. 5e is an image of the sample after deposited with a 300 nm $SiO_2$ layer to serve as an insulating layer of the light emitting element of the embodiment of the invention.
Figure 5F:
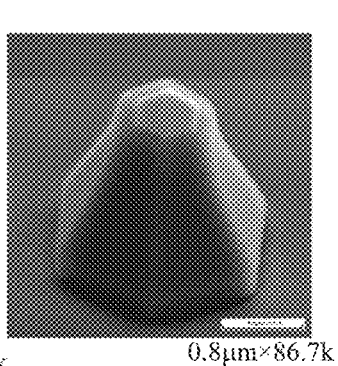
FIG. 5f is a side-view image of the sample covered by the $SiO_2$ layer with an upper electrically conductive portion exposed of the light emitting element of the embodiment of the invention.
Figure 5G:
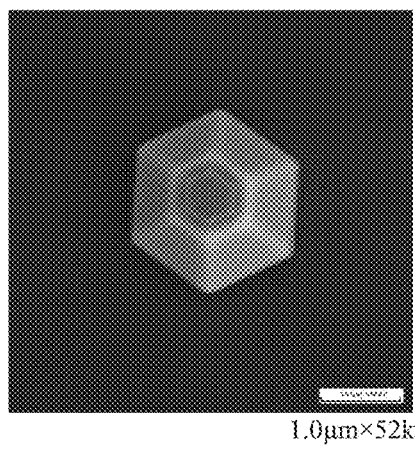
FIG. 5g is a top-view image of the sample covered by the $SiO_2$ layer with an upper electrically conductive portion exposed of the light emitting element of the embodiment of the invention.
Figure 5H:
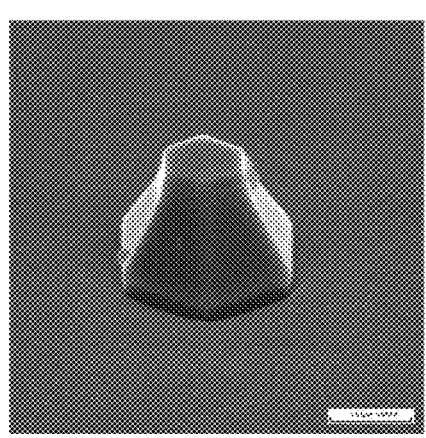
FIG. 5h is an image of the sample with the exposed upper electrically conductive portion disposed by titanium of the light emitting element of the embodiment of the invention.

FIGS. 5a-5h are images of surface measurement of another sample of the light emitting according to the embodiment of the present invention, with the images obtained from No. d10 gallium nitride pyramid sample. FIGS. 5a, 5b and 5c are the electron microscope images of the gallium nitride pyramid of the light emitting element. From the regular hexagonal shape of the appearance of the gallium nitride pyramid, the gallium nitride pyramid is proved to have a high-quality single crystal structure. FIG. 5d is an image of the gallium nitride pyramid, with the gallium nitride pyramid removed independently, inversely disposed on a p-type gallium nitride layer and annealed at 700° C. to weld the contact faces of the gallium nitride pyramid and the gallium nitride layer. FIG. 5e is an image of the sample after deposited with a $SiO_2$ layer of 300 nm in thickness as an insulating layer between the n-type electrode and the p-type electrode. FIGS. 5f and 5g are images of the sample covered by the deposited $SiO_2$ layer, with a portion of the insulating layer on top of the gallium nitride pyramid and a portion of the apex of the gallium nitride pyramid removed to expose an upper portion of an electrode. FIG. 5h is an image of the sample with the electrode having an exposed upper portion, with a layer of titanium of about 30 nm in thickness deposited as an upper electrode.

Figure 6A:
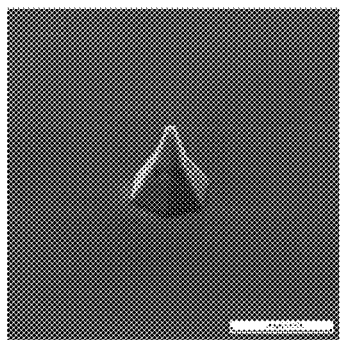
FIG. 6a is an electron microscope image of a gallium nitride pyramid of another sample of the light emitting element according to the embodiment of the invention.
Figure 6B:
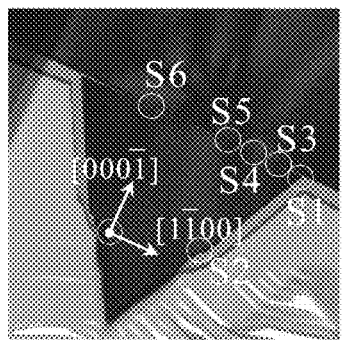
FIG. 6b is a transmission electron microscope (TEM) image of the sample with the incident direction along [11$\bar{2}$0] of the light emitting element of the embodiment of the invention.
Figure 6C:
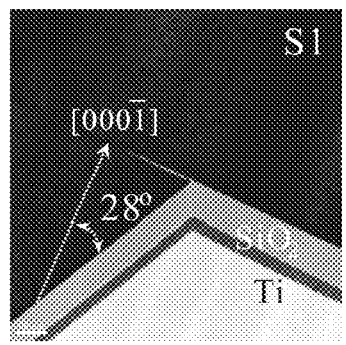
Figure 6D:
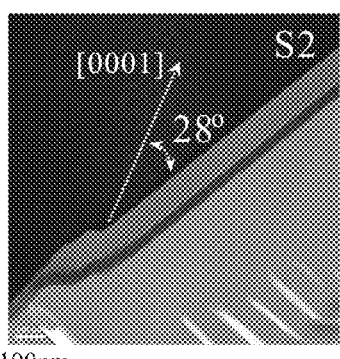
Figure 6E:
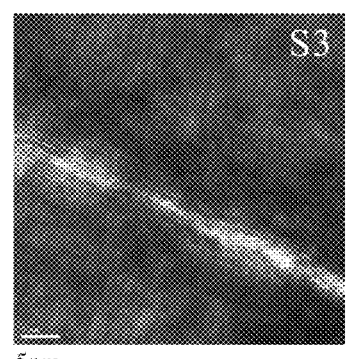
FIGS. 6e-6i are high-resolution atomic images of interfaces of the gallium nitride pyramid and a gallium nitride layer of the sample of the light emitting element of the embodiment of the invention.
Figure 6F:
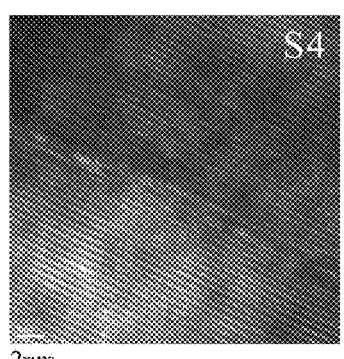
Figure 6G:
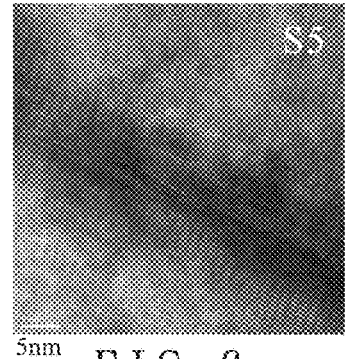
Figure 6H:
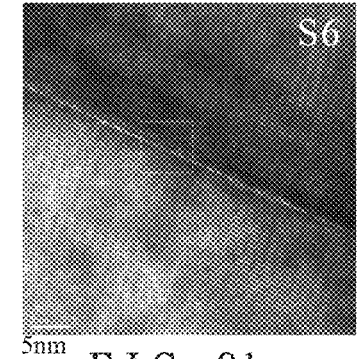
Figure 6I:
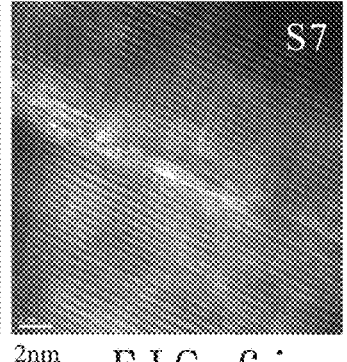
Figure 6J:
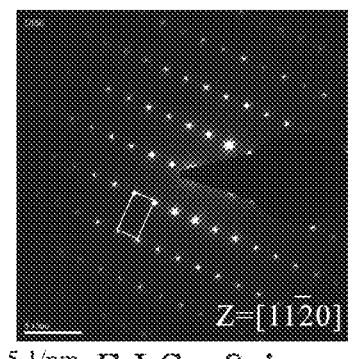
FIG. 6j is the diffraction pattern of the gallium nitride pyramid of the sample of the light emitting element of the embodiment of the invention.
Figure 6K:
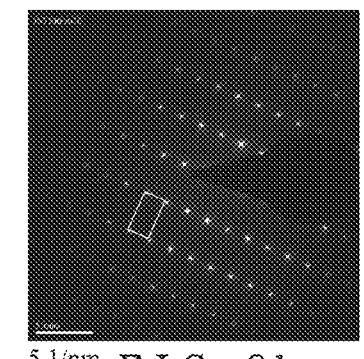
FIG. 6k is the diffraction pattern at the interfaces of the gallium nitride pyramid and the gallium nitride layer of the sample of the light emitting element of the embodiment of the invention.
Figure 6L:
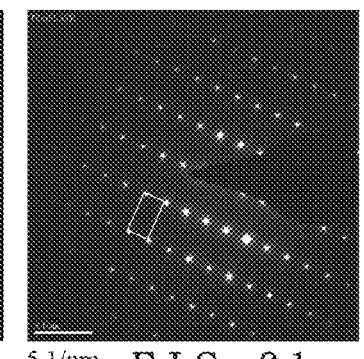
FIG. 6l is a diffraction pattern of the gallium nitride layer of the sample of the light emitting element of the embodiment of the invention.

FIGS. 6a-6l are images of structure analysis of another sample of the light emitting element according to the embodiment of the present invention, with the images obtained from No. d5 gallium nitride pyramid sample. FIG. 6a is an electron microscope image of the completed gallium nitride pyramid. FIG. 6b is a transmission electron microscope (TEM) image of the sample with the incident direction of [11$\bar{2}$0], illustrating the sample covered by the $SiO_2$ insulating layer and the titanium electrode and illustrating the coupling of the hexagonal crystal of the gallium nitride pyramid with the titanium electrode and the gallium nitride layer. FIGS. 6c and 6d are enlarged images of FIG. 6a, with a slant face of the gallium nitride hexagonal pyramid being 28°, which matches $\theta=\tan^{-1}(d_{1\underline{1}00}/d_{000\underline{1}})$, with $d_{1\underline{1}00}$ and $d_{000\underline{1}}$ being the length of the M-axis of the gallium nitride and the length of the c-axis of the gallium nitride respectively, showing that the sample has a high-quality single crystal structure. FIGS. 6e-6i are high-resolution atomic images of the interface of the gallium nitride pyramid and the gallium nitride layer. It is found that the interfaces of the semiconductors have been truly coupled after the high-temperature annealing. In the portion shown in FIG. 6g near the bottom of the center is found to have the best coupling effect, because the contact faces of the two semiconductors could not be distinguished. FIGS. 6j-6l are SAD images; FIG. 6j is the diffraction pattern of the gallium nitride pyramid; FIG. 6k is the diffraction pattern at the interface of the gallium nitride pyramid and the gallium nitride layer, and shows a diffraction pattern of a single lattice of the gallium nitride pyramid and the gallium nitride layer after coupled with matched lattices of the gallium nitride pyramid and the gallium nitride layer; and FIG. 6l is a diffraction pattern of the gallium nitride layer with the same incident direction, and shows that the direction of the gallium nitride layer matches with the direction of the gallium nitride pyramid. Thus, it is proved that the proper current-voltage curve for the light emitting element can successfully be measured if the lattice direction of the gallium nitride pyramid matches with the lattice direction of the gallium nitride layer.

By the above technical solutions, the main features of the light emitting element according to the present invention are that the large end face 22 of the gallium nitride pyramid 2 contacts with the mounting face 11 of the gallium nitride layer 1, the c-axis of the gallium nitride pyramid 2 is coaxial with the c-axis of the gallium nitride layer 1, the M-plane of the gallium nitride pyramid 2 is parallel to the M-plane of the gallium nitride layer 1, and the broken bonds at the large end face 22 of the gallium nitride pyramid 2 and the mounting face 11 of the gallium nitride layer 1 weld together. Hence, the gallium nitride layer 1 and the gallium nitride pyramid 2 of the light emitting element tightly couple together to match the lattice of the gallium nitride layer 1 (a p-type semiconductor) with the lattice of the gallium nitride pyramid 2 (an n-type semiconductor), while avoiding epitaxial defects generated in the light emitting element and reinforcing the bonding between the gallium nitride layer 1 and the gallium nitride pyramid 2 to enhance the coupling strength, thereby permitting free flow of electrons to enhance the electroluminescence effect. The effects of increasing the light emitting efficiency and improving the light emitting stability can, thus, be achieved.

Furthermore, since difficulties in manufacturing of electrodes are encountered in the trend of decreasing the sizes of photoelectric elements, the present invention provides the first electrode 4 covering the gallium nitride pyramid 2 and exposing the smaller end face 21 outside of the insulating layer 3 and provides the second electrode 5 connected to the gallium nitride layer 1 below the insulating layer, such that the first and second electrodes 4 and 5 can easily be manufactured while providing an effective insulating effect, solving the bottleneck in manufacturing of the electrodes of nanoscale photoelectric elements.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A light emitting element with an enhanced electroluminescence effect, comprising:
   a gallium nitride layer having a mounting face, wherein the gallium nitride layer grows in [0001] direction of a four-axis coordinate system, wherein an end of the mounting face of the gallium nitride layer is terminated with nitrogen elements;
   a gallium nitride pyramid having a larger end face and a smaller end face, wherein the gallium nitride pyramid grows in [000$\underline{1}$] direction of the four-axis coordinate system, wherein an end of the larger end face of the gallium nitride pyramid is terminated with gallium elements, wherein the larger end face of the gallium nitride pyramid contacts with the mounting face of the gallium nitride layer, with a c-axis of the gallium nitride layer coaxial with a c-axis of the gallium nitride pyramid, and with an M-plane of the gallium nitride layer parallel to an M-plane of the gallium nitride pyramid, wherein broken bonds at the larger end face of the gallium nitride pyramid and the mounting face of the gallium nitride layer weld together, wherein nitrogen elements of the end of the mounting face bond to gallium elements of the end of the larger end face, wherein the gallium nitride layer is a p-type semiconductor and the gallium nitride pyramid is an n-type semiconductor;

an insulating layer covering surfaces of the gallium nitride layer and the gallium nitride pyramid, wherein a portion of the gallium nitride pyramid is not covered by the insulating layer to form an electrically conductive portion of the gallium nitride pyramid, and a portion of the gallium nitride layer is not covered by the insulating layer to form another electrically conductive portion of the gallium nitride layer;

a first electrode electrically connecting to the electrically conductive portion of the gallium nitride pyramid; and a second electrode electrically connecting to the electrically conductive portion of the gallium nitride layer, wherein a top of the gallium nitride pyramid is truncated and flush with a surface of insulating layer.

2. The light emitting element with an enhanced electroluminescence effect as claimed in claim 1, wherein the insulating layer is an oxidation layer.

3. The light emitting element with an enhanced electroluminescence effect as claimed in claim 2, wherein the oxidation layer contains aluminum oxide or silicon oxide.

4. The light emitting element with an enhanced electroluminescence effect as claimed in claim 1, wherein a thickness of the insulating layer is 200-300 nm.

5. The light emitting element with an enhanced electroluminescence effect as claimed in claim 1, wherein the first electrode comprises of titanium, aluminum, titanium-aluminum alloy, titanium-nickel alloy, or titanium-aluminum-nickel-gold alloy.

6. The light emitting element with an enhanced electroluminescence effect as claimed in claim 1, wherein the second electrode comprises of nickel-platinum alloy, nickel-gold alloy, or nickel-platinum-gold alloy.

* * * * *